(12) United States Patent
Suzuki (10) Patent No.: US 8,451,653 B2
(45) Date of Patent: May 28, 2013

(54) SEMICONDUCTOR INTEGRATED CIRCUIT HAVING A TEST FUNCTION FOR DETECTING A DEFECTIVE CELL

(75) Inventor: Toshikazu Suzuki, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/335,338

(22) Filed: Dec. 22, 2011

(65) Prior Publication Data

US 2012/0092922 A1    Apr. 19, 2012

Related U.S. Application Data

(63) Continuation of application No. PCT/JP2010/001473, filed on Mar. 3, 2010.

(30) Foreign Application Priority Data

Jun. 30, 2009    (JP) ................................ 2009-154730

(51) Int. Cl.
*G11C 11/00* (2006.01)

(52) U.S. Cl.
USPC ........... 365/154; 365/201; 365/226; 365/233; 365/200

(58) Field of Classification Search
USPC ........................ 365/154, 201, 226, 233, 200
See application file for complete search history.

(56) References Cited

U.S. PATENT DOCUMENTS

| 4,267,583 | A | | 5/1981 | Suzuki | |
|---|---|---|---|---|---|
| 5,576,996 | A | | 11/1996 | Awaya et al. | |
| 6,161,204 | A | * | 12/2000 | Gans | 714/718 |
| 6,711,076 | B2 | * | 3/2004 | Braceras | 365/201 |
| 6,757,205 | B2 | * | 6/2004 | Salters | 365/201 |
| 6,778,450 | B2 | | 8/2004 | Selvin et al. | |
| 6,894,945 | B2 | * | 5/2005 | Sawada | 365/233.11 |
| 6,895,537 | B2 | * | 5/2005 | Kawagoe et al. | 714/710 |
| 2001/0033519 | A1 | | 10/2001 | Koshikawa | |

FOREIGN PATENT DOCUMENTS

| JP | 50-134738 | 10/1975 |
|---|---|---|
| JP | 2001-126497 | 5/2001 |
| JP | 2004-118925 | 4/2004 |

OTHER PUBLICATIONS

International Search Report issued in International Patent Application No. PCT/JP2010/001473 dated Jun. 15, 2010.

* cited by examiner

*Primary Examiner* — Connie Yoha
(74) *Attorney, Agent, or Firm* — McDermott Will & Emery LLP (57) ABSTRACT

Flip-flop memory cells are connected to a pair of bit lines and respectively to word lines. A word line driver outputs a word line selection pulse to one of the word lines in a word line selection period. A write circuit gives a potential difference corresponding to input data to the pair of bit lines after a start of the word line selection period. In a first operation mode, the potential difference of the pair of bit lines is reset in the word line selection period, and in the second mode, the potential difference of the pair of bit lines is reset after the word line selection period.

9 Claims, 5 Drawing Sheets

FIG.1

FIG.2A OPERATING TIMING IN NORMAL MODE

FIG.2B OPERATING TIMING IN TEST MODE

SEMICONDUCTOR INTEGRATED CIRCUIT HAVING A TEST FUNCTION FOR DETECTING A DEFECTIVE CELL

CROSS-REFERENCE TO RELATED APPLICATION

This is a continuation of PCT International Application PCT/JP2010/001473 filed on Mar. 3, 2010, which claims priority to Japanese Patent Application No. 2009-154730 filed on Jun. 30, 2009. The disclosures of these applications including the specifications, the drawings, and the claims are hereby incorporated by reference in their entirety.

BACKGROUND

The present disclosure relates to a semiconductor integrated circuit including flip-flop memory cells, and more particularly to a test function for extracting a defective memory cell.

The degree of integration of semiconductor integrated circuits has been increased over the years. As a circuit which is particularly required to be formed with a high degree of integration since the data processing amount has been increased, static random access memory (SRAM) which stores data is known. In a SRAM, flip-flop memory cells are integrated on a large scale. Despite its high degree of integration, stored data has to be held at all the time, all of memory transistors have to correctly operate at the same time.

However, as the degree of integration increases due to reduction in process size, defects in some transistors forming SRAM memory cells might be caused during process steps, and thus, defective memory cells which cannot hold data correctly might be generated.

A memory cell in which a defect has been caused has to be detected by a test and replaced with a redundant memory cell which operates correctly before shipping. However, for some defective memory cells, many steps are required for detecting defects. For example, there are defective memory cells which pass a test at room temperature which is normally performed, but cannot hold data and fail a test at low temperature.

As one of examples of such defective memory cells, there is a defective memory cell in which process to a contact of a PMOS transistor forming a flip-flop with a power supply source is not sufficient, and thus a resistance is increased as compared to a normal memory cell. In such a defective memory cell, a current power supply from the power supply source is not sufficient, and thus, a state in which high data is held becomes unstable.

Figure 5:
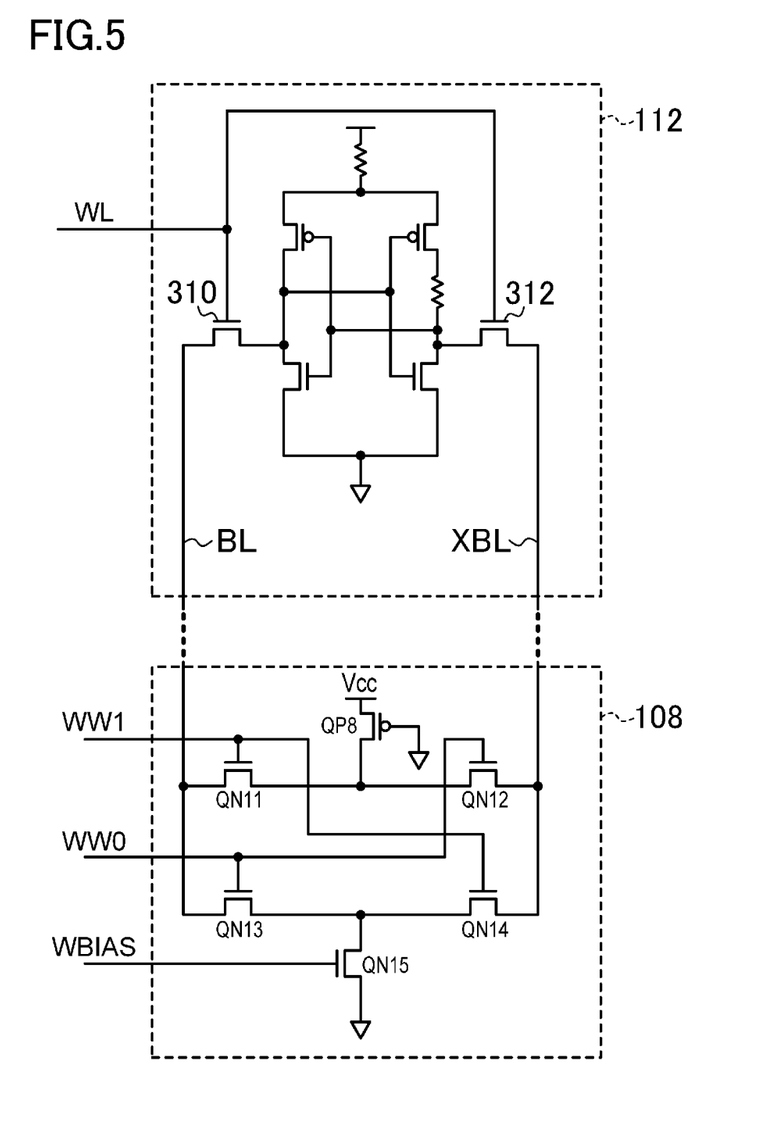
FIG. 5 is a circuit diagram illustrating an example configuration of a conventional semiconductor integrated circuit.

Conventionally, test circuits which extract such defective memory cells have been proposed (for example, see the specification (FIG. 3) of U.S. Pat. No. 6,778,450). FIG. 5 illustrates the configuration of such a test circuit. In the configuration of FIG. 5, separately from a write circuit used during a normal operation, a write test circuit 108 is provided to a memory cell 112. At a test, when the bit line BL side is tested, a test write signal WW0 rises, and when the bit line XBL side is tested, a test write signal WW1 rises. For example, when the test write signals WW0 and WW1 become a low level and a high level, respectively, NMOS transistors QN11 and QN14 become conductive, and NMOS transistors QN12 and QN13 are maintained nonconductive. As a result, a potential of (Vdd−Vtn) is supplied to a bit line BL via a PMOS transistor QP8 and the NMOS transistor QN11. On the other hand, a weak write potential Vww is supplied to a bit line XBL via NMOS transistors QN15 and QN14.

The weak write potential Vww is an intermediate potential between the Vss level and the Vdd level, and is adjusted by a bias potential WBIAS to be supplied to a gate of the NMOS transistor QN15. The weak write potential Vww is set to a potential with which data write to a high data holding node of a normal memory cell cannot be performed but data write to a high data holding node of a defective memory cell can be performed. That is, when a resistance of a source of a PMOS transistor in a memory cell has been increased, a stored data is inverted by supplying the intermediate potential which is low enough not to cause inversion of stored data in a normal memory cell via a bit line. Thereafter, data is read and whether the inversion took place or not is verified, thereby identifying a defective memory cell.

SUMMARY

However, in the above-described conventional semiconductor integrated circuit, separately from a write circuit used during a normal operation, a write test circuit is needed. Moreover, a programmable bias generation circuit for supplying the adjusted bias potential WBIAS to the write test circuit is needed. Accordingly, an area of a memory cell array section and a control section is increased, thus resulting in increase in cost of LSI.

Also, in the above-described conventional semiconductor integrated circuit, to set the weak write potential Vww, a bias potential WBIAS has to be adjusted with high accuracy. Therefore, for the level setting, a pre-test has to be performed to many memories to check whether a defective memory cell can be extracted or not. Accordingly, the number of test steps is increased.

Furthermore, technically, the weak write potential Vww has to be set in consideration of a conduction resistance of an access transistor (e.g., 310, 312 in FIG. 5) in a memory cell. Therefore, variations in conduction resistance of the access transistor which is not directly relevant to a defect affect accuracy of the test. Among memory cells, the access transistor has to be formed to have a particularly small size for bit line noise, and accordingly, variations in conduction resistance are likely to increase in future as the process size is reduced. Thus, it seems that setting of the weak write potential Vww becomes more difficult in future, and this will be a problem in view of test reliability.

It is therefore an object of the present disclosure to realize a test function for extracting a defective memory cell in a semiconductor integrated circuit having flip-flop memory cells such as SRAMs without causing large increase in circuit area and increase in the number of test steps, and without being affected by variations in transistor characteristic caused by reduction in size of the semiconductor integrated circuit.

A semiconductor integrated circuit according to one embodiment includes a pair of bit lines, a plurality of word lines, a plurality of flip-flop memory cells connected to the pair of bit lines and respectively to the word lines, a word line driver configured to output a word line selection pulse to a word line of the plurality of word lines in a word line selection period, and a write circuit configured to give a potential difference corresponding to input data to the pair of bit lines after a start of the word line selection period, and in a first operation mode, the potential difference is reset in the word line selection period for the pair of bit lines to which the potential difference has been given, and in a second operation mode, the potential difference is reset after the word line selection period for the pair of bit lines to which the potential difference has been given.

According to this embodiment, after a start of the word line selection period, a potential difference according to input data is given to the pair of bit lines. Then, in the first operation mode, the potential difference is reset for the pair of bit lines to which the potential difference has been given in the word line selection period. Thus, if any defect exists in the flip-flop memory cells and change in level of the flip-flops is slow while data is written, the level of a node returns to what it was by the reset of the pair of bit lines during the word line selection period. That is, a data write fails. Thus, a defective memory cell can be identified by subsequent data read. On the other hand, in the second operation mode, the potential difference is reset for the pair of bit lines to which the potential difference has been given after the word line selection period, and thus, normal data write is realized. As described above, a test function for extracting a defective memory cell can be realized only by adjusting a timing of reset of the potential of the pair of bit lines and a timing of end of the word line selection period.

According to the present disclosure, in a semiconductor integrated circuit including flip-flops such as SRAMs, a test function for extracting a defective memory cell can be realized by adjusting a timing of resetting the potential of the pair of bit lines and a timing of end of the word line selection period. Thus, large increase in circuit area and increase in cost of LSIs, or increase in the number of test steps can be avoided. Moreover, a strict potential setting which has been conventionally required is not necessary, and therefore, there is hardly any influence of variations in transistor characteristic caused by size reduction.

BRIEF DESCRIPTION OF THE DRAWINGS

FIG. 2A shows a write operation during a normal mode, and FIG. 2B shows a write operation during a test mode.

FIG. 4A shows a write operation during a normal mode, and FIG. 4B shows a write operation during a test mode.

DETAILED DESCRIPTION

Embodiments will be described below with reference to the accompanying drawings.

(First Embodiment)

Figure 1:
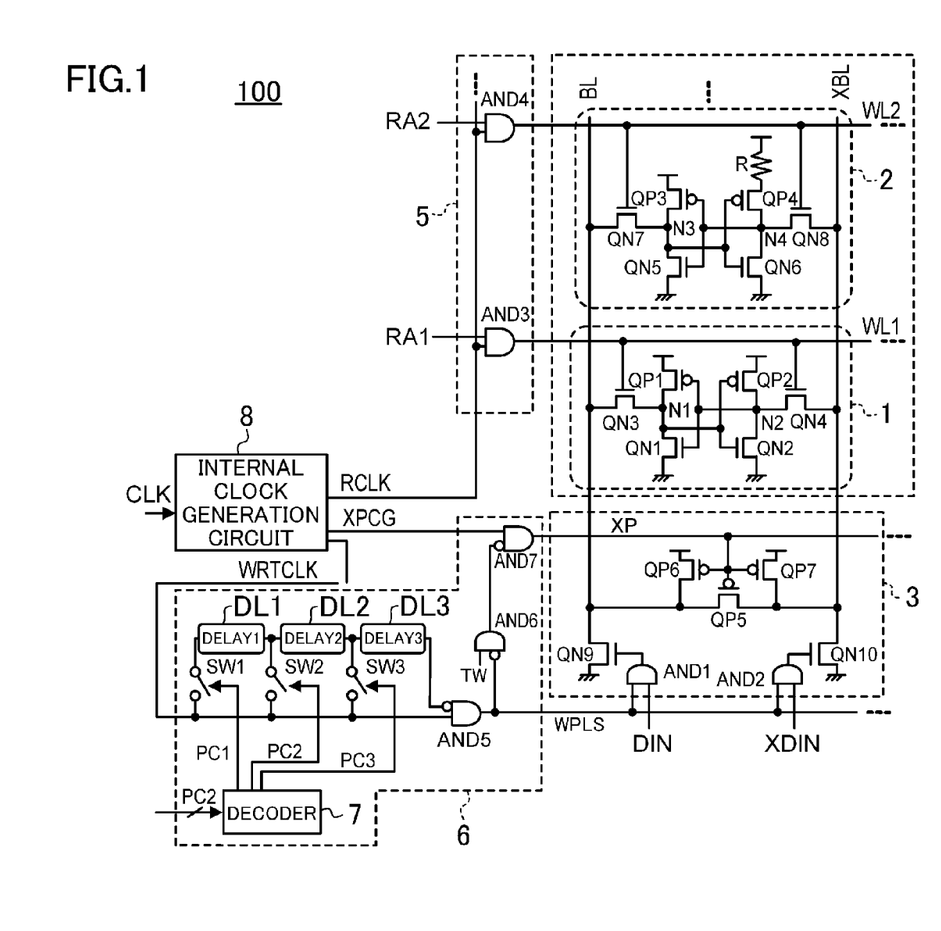
FIG. 1 is a circuit diagram illustrating an example configuration of a semiconductor integrated circuit according to a first embodiment.
Figure 2A:
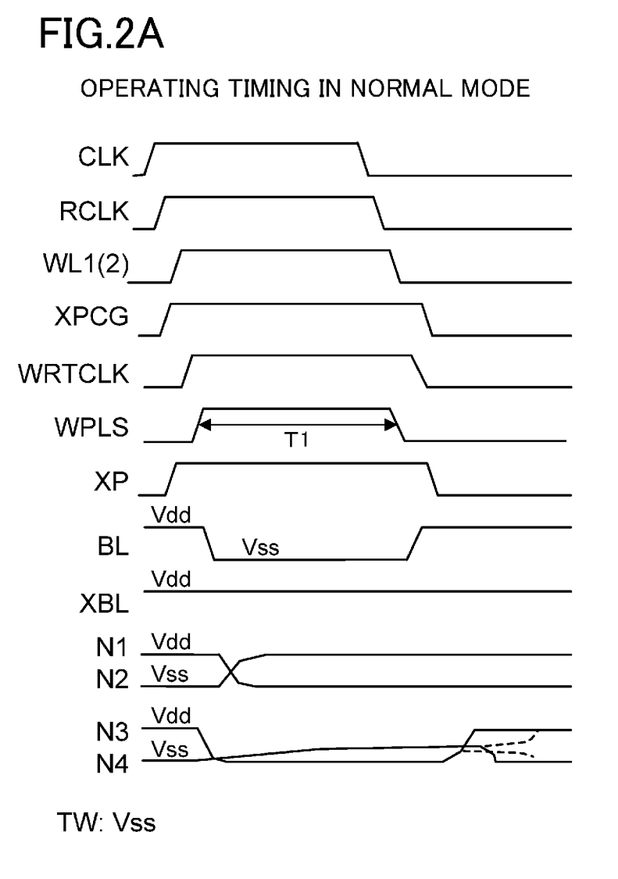
FIGS. 2A and 2B are charts showing the operation of the semiconductor integrated circuit of FIG. 1.
Figure 2B:
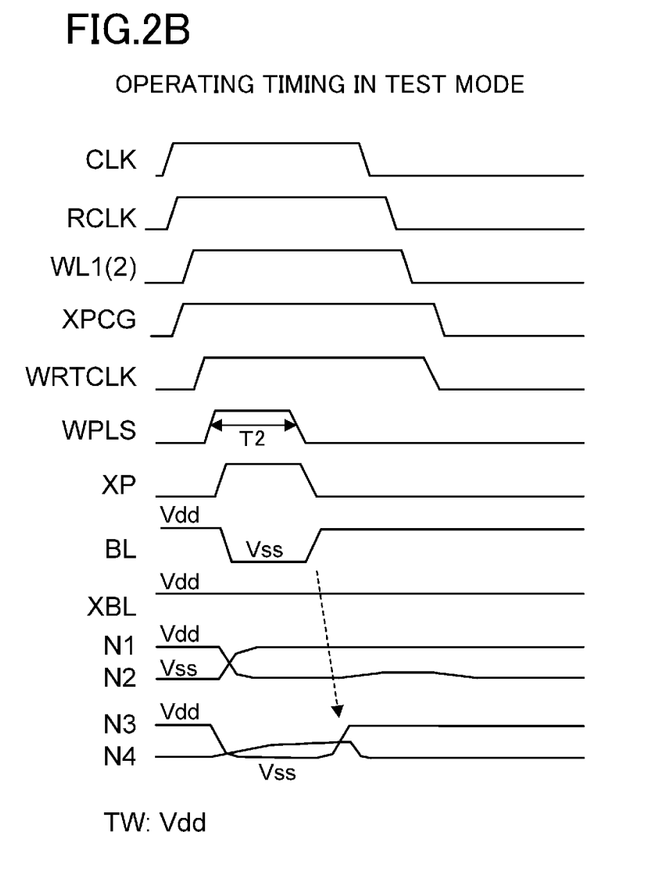

FIG. 1 is a circuit diagram illustrating an example configuration of a semiconductor integrated circuit according to a first embodiment, and FIGS. 2A and 2B are operating timing charts of the semiconductor integrated circuit of FIG. 1.

A semiconductor integrated circuit 100 of FIG. 1 includes a pair of bit lines BL and XBL, word lines WL1 and WL2, flip-flop memory cells 1 and 2 connected to the pair of bit lines BL and XBL and respectively to the word lines WL1 and WL2, a write circuit 3 configured to give a potential difference according to input data DIN and XDIN to the pair of bit lines BL and XBL, a word line driver 5 configured to selectively drive one of the word lines WL1, WL2, . . . , a write control circuit 6 configured to control the write circuit 3, and an internal clock generation circuit 8.

A memory cell 1 includes PMOS transistors QP1 and QP2, NMOS transistors QN1, QN2, QN3, and QN4. The PMOS transistors QP1 and QP2 and the NMOS transistors QN1 and QN2 form a flip-flop for storing data, and the flip-flop includes memory nodes N1 and N2. Each of the NMOS transistors QN3 and QN4 is provided so that a gate thereof is connected to the word line WL1, one of a drain and a source thereof is connected to an associated one of the memory nodes N1 and N2 of the flip-flop, and the other of the drain and the source is connected to an associated one of the bit lines BL and XBL.

Similar to the memory cell 1, a memory cell 2 includes PMOS transistors QP3 and QP4, NMOS transistors QN5, QN6, QN7, and QN8. The PMOS transistors QP3 and QP4 and the NMOS transistors QN5 and QN6 form a flip-flop for storing data, and the flip-flop includes memory nodes N3 and N4. Each of the NMOS transistors QN7 and QN8 is provided so that a gate thereof is connected to the word line WL2, one of a drain and a source thereof is connected to an associated one of the memory nodes N3 and N4, and the other of the drain and the source is connected to an associated one of the bit lines BL and XBL.

In this embodiment, the memory cell 1 is a normal memory cell. On the other hand, the memory cell 2 is a defective memory cell, and a high resistance R is generated due to a machining defect between the source of the PMOS transistor QP4 and the power supply source Vdd.

The write circuit 3 includes PMOS transistors QP5, QP6, and QP7, NMOS transistors QN9 and QN10, and AND gates AND1 and AND2. Each of the AND gates AND1 and AND2 receives an associated one of input data DIN and XDIN, and a write pulse clock WPLS, and outputs of the AND gates AND1 and AND2 are supplied respectively to gates of the NMOS transistors QN9 and QN10. The NMOS transistors QN9 and QN10 are controlled by the outputs of the AND gates AND1 and AND2, and supplies a ground level to the bit lines BL and XBL. The PMOS transistors QP5-QP7 receive a precharge control signal XP at gates thereof. A source and a drain of the PMOS transistor QP5 are connected to the bit lines BL and XBL, respectively, and each of the PMOS transistors QP6 and QP7 is provided so that a drain thereof is connected to an associated one of the bit lines BL and XBL and a source thereof is connected to the power supply source Vdd. A precharge function of the bit lines BL and XBL is realized by the PMOS transistors QP5-QP7.

The word line driver 5 includes AND gates AND3 and AND4. Each of the AND gates AND3 and AND4 receives an associated one of row address signals RA1 and RA2, and a word line drive clock RCLK, and outputs of the AND gates AND3 and AND4 are connected to the word lines WL1 and WL2, respectively.

The internal clock generation circuit 8 receives a clock signal CLK, and outputs the word line drive clock RCLK, an original precharge control signal XPCG, and a write control clock WRTCLK.

The write control circuit 6 includes a decoder 7, AND circuits AND5-AND7, and delay elements DL1-DL3 connected in series to one another. A signal line of the write control clock WRTCLK is connected to inputs of the delay elements DL1-DL3 via switches SW1-SW3, respectively. The decoder 7 generates pulse control signals PC1-PC3 in accordance with a value of a 2-bit pulse program signal PC. The switches SW1-SW3 are controlled to be on/off by the pulse control signals PC1-PC3, respectively. The AND circuit AND5 receives an inverted signal of an output of the delay element DL3 and the write control clock WRTCLK, and outputs the write pulse clock WPLS. The write pulse clock WPLS is supplied to the write circuit 3.

The AND circuit AND6 receives an inverted signal of the write pulse clock WPLS, and a test mode write signal TW. The AND circuit AND7 receives an inverted signal of an output of the AND circuit AND6 and the original precharge control signal XPCG, and outputs a precharge control signal XP. The precharge control signal XP is supplied to the write circuit 3.

<Operation>

The operation of the semiconductor integrated circuit of this embodiment configured as described above will be described with reference FIGS. 2A and 2B. FIG. 2A shows a write operation during a normal mode, and FIG. 2B shows a write operation during a test mode. The test mode write signal TW becomes a Vss level, which is a low level, in the normal mode, and becomes a Vdd level, which is a high level, in the test mode.

—Normal Mode—

In a non-selected state before a write operation, the word lines WL1 and WL2 are at the Vss level, which is the low level. Since the original precharge control signal XPCG and the precharge control signal XP are at the low level, the PMOS transistors QP5-QP7 become conductive, and thus, the bit lines BL and XBL are prechareged to the Vdd level. The word line drive clock RCLK and the write control clock WRTCLK are at the low level.

In the write control circuit 6, the decoder 7 receives the pulse program signal PC corresponding to the normal mode, and sets a pulse control signal PC1 "selection" and other pulse control signal PC2 and PC3 "non-selection." Thus, the switch SW1 is turned in an on state, the switches SW2 and SW3 are turned in an off state, and an input of the delay element DL1 receives the write control clock WRTCLK. As a result, the write pulse clock WPLS to be supplied to the write circuit 3 becomes the longest pulse reflecting the sum of respective delay times of the delay elements DL1-DL3.

When a write operation is started and the clock signal CLK rises, the internal clock generation circuit 8 causes the word line drive clock RCLK, the original precharge control signal XPCG, and the write control clock WRTCLK to rise. Since the test mode write signal TW is at the low level, an output of the AND circuit AND6 is at the low level, and the level of the precharge control signal XP is equal to that of the original precharge control signal XPCG When the precharge control signal XP rises, the PMOS transistors QP5-QP7 become non-conductive, and supply of a potential to the bit lines BL and XBL is stopped. Concurrently, one of the row address signals RA1 and RA2 rises. Since the word line drive clock RCLK is at the high level, the level of one of the word lines WL1 and WL2 rises according to the row address signals RA1 and RA2. That is, the word line driver 5 outputs a word line selection pulse to one of the word lines WL1 and WL2 in a word line selection period.

Subsequently, the write control clock WRTCLK rises, and the write pulse clock WPLS rises. Concurrently, one of the input data DIN and XDIN becomes the high level, one of the outputs of the AND circuits AND1 and AND2 of the write circuit 3 becomes the high level, one of the NMOS transistors QN9 and QN10 becomes conductive, and one of the bit lines BL and XBL transitions to the Vss level. FIG. 2A shows a case where the NMOS transistor QN9 becomes conductive, the bit line BL transitions to the Vss level, and the bit line XBL stays at the Vdd level.

A pulse period T1 of the write pulse clock WPLS (a pulse period of the bit line BL) is a period reflecting signal delay times of the delay elements DL1-DL3.

When the normal memory cell 1 is selected by the word line WL1, the following operation is performed. If the Vdd level and the Vss level are stored at the node N1 and the node N2, respectively, in the memory cell 1 in advance, the bit line BL transitions from the Vdd level to the Vss level. Thus, the node N1 transitions from the Vdd level to the Vss level, and the node N2, which forms a pair with the node N1 in the flip-flop, transitions from the Vss level to the Vdd level, stored data is inverted, and a write operation is correctly performed.

On the other hand, when the defective memory cell 2 is selected by the word line WL2, the following operation is performed. If the Vdd level and the Vss level are stored at the node N3 and the node N4, respectively, in advance, the bit line BL transitions from the Vdd level to the Vss level, and thus, the node N3 transitions from the Vdd level to the Vss level. However, since a source of the PMOS transistor QP4 has an increased resistance and only a small amount of a current is supplied to the node N4, rise of level of the node N4 becomes slow. A current from the bit line XBL at the Vdd potential is also supplied to the node N4 via the NMOS transistor (access transistor) QN8. However, the word line WL2 subsequently falls to be in non-selected state, so that the NMOS transistor QN8 becomes nonconductive, the node N4 is at an intermediate level, and thus, the level of the node N3 at an opposite side to the node N4 in the flip-flop increases.

At this time, if the level of the node N4 has reached a necessary level for inversion of stored data, the level of the node N4 continues to increase as indicated by a broken line in FIG. 2A, and the node N3 returns to the Vss level. Thus, data is inverted, and a write operation is correctly performed. However, as indicated by a solid line in FIG. 2A, if the level of the node N4 is not sufficient, the node N4 returns to the Vss level, the node N3 returns to the Vdd level, and a write operation fails. The level of the node N4 depends on, for example, the amount of a current flowing in the node N4 from the bit line XBL via the access transistor QN8 until the word line WL2 becomes non-selected. For example, when at ambient temperature and the access transistor QN8 has the low threshold and the high current capability, the level of the node N4 is high, and a write operation is correctly performed. On the other hand, when at low temperature and the access transistor QN8 has the high threshold and the low current capability, the level of the node N4 is low, and a write operation fails.

That is, as shown by operating waveforms of the nodes N1-N4, during the normal mode, while a write operation is correctly performed in the normal memory cell 1, a write operation is unstable in the defective memory cell 2.

—Test Mode—

In the write control circuit 6, the decoder 7 receives a pulse program signal PC corresponding to a test mode, and sets the pulse control signal PC3 "selection" and the other pulse control signals PC1 and PC2 "non-selection." Thus, the switch SW3 is turned in an on state, the switches SW1 and SW2 are turned in an off state, and the write control clock WRTCLK is supplied to the input of the delay element DL3. As a result, the write pulse clock WPLS to be supplied to the write circuit 3 becomes a short pulse reflecting only a delay time of the delay element DL3.

Since the test mode write signal TW is at the high level, an output of the AND circuit AND6 is equal to the level of the write pulse clock WPLS. Thus, the level of the precharge control signal XP is at a level reflecting both of the original precharge control signal XPCG and the write pulse clock WPLS. Other non-selected states before a write operation are the same as those in the normal mode.

When a write operation is started and the clock signal CLK rises, the internal clock generation circuit 8 causes the word line drive clock RCLK, the original precharge control signal XPCG, and the write control clock WRTCLK to rise. When the write control clock WRTCLK rises, the write pulse clock WPLS rises accordingly. Subsequently, the precharge control signal XP rises, the PMOS transistors QP5-QP7 become non-conductive, and supply of a potential to the bit lines BL and XBL is stopped. Selection by the word lines WL1 and WL2 is performed in the same manner as in the normal mode.

Concurrently, one of the input data DIN and XDIN becomes the high level, one of outputs of the AND circuits AND1 and AND2 of the write circuit 3 becomes the high level, one of the NMOS transistors QN9 and QN10 becomes conductive, and one of the bit lines BL and XBL transitions to the Vss level. FIG. 2B shows a case where the NMOS transistor QN9 becomes conductive, the bit line BL transitions to the Vss level, and the bit line XBL stays at the Vdd level.

A pulse period T2 of the write pulse clock WPLS (a pulse period of the precharge control signal XP and the bit line BL) is a period reflecting a signal delay time of the delay element DL3.

An operation when the normal memory cell 1 is selected by the word line WL1 is the same as that in the normal mode. That is, when the bit line BL falls to the Vss level, stored charge at the node N1 is discharged, the node N1 transitions to the Vss level. Since the current capability of the PMOS transistor QP2 is sufficient, the level of the node N2 quickly transitions to the Vdd level, stored data is inverted, and a write operation is correctly performed.

On the other hand, when the defective memory cell 2 is selected by the word line WL2, the following operation is performed. If the Vdd level and the Vss level are stored at the node N3 and the node N4, respectively, in advance, the node N3 is discharged by the bit line BL to transition to the Vss level, and the node N4 increases from the Vss level. However, since the source of the PMOS transistor QP4 has an increased resistance and supply of a current from the PMOS transistor QP4 is not sufficient, rise of level of the node N4 becomes slow.

Subsequently, the write pulse clock WPLS falls sooner than in the normal mode. Thus, the precharge control signal XP falls, and the level of the bit line BL increases.

As a result, a current is supplied to the node N3 from the bit line BL, and the node N3 transitions from the Vss level to the Vdd level. At this time, since the level of the node N3 increases, the current capability of the NMOS transistor QN6 increases, and the node N4 which is at an intermediate potential between the Vdd level and the Vss level reduces from the intermediate level to the Vss level. That is, stored data is not inverted, and data cannot be correctly written. The stored data in the defective memory cell 2 which has failed to be written is detected in a subsequent read cycle, thereby allowing identification of a defective memory cell.

As described above, in this embodiment, in the test mode, a pulse width of the write pulse clock WPLS is set to be shorter than that in the normal mode to cause the level of the bit line BL which has been once discharged to the Vss level to rise sooner than in the normal mode. That is, for the pair of bit lines BL and XBL to which a potential difference is given after a start of the word line selection period, the potential difference is reset in the word line selection period. Thus, in the defective memory cell 2, the level of the node N3 rises, and accordingly, the current capability of the NMOS transistor QN6 increases. Therefore, when supply of a current from the PMOS transistor QP4 is not sufficient, the potential of the node N4 reduces. That is, data write is blocked, and thus, a defective memory cell can be extracted by reading stored data afterward. Note that in the normal memory cell 1, the current capability of the PMOS transistor QP4 is sufficient, and data write is correctly performed, as shown by the nodes N1 and N2 of FIG. 2B.

Also, in this embodiment, in the test mode, a write operation is performed using the write circuit 3 as in the normal mode. Therefore, as opposed to the conventional technique, a write circuit and a bias generation circuit for the test mode do not have to be used. Also, in this embodiment, since only the simple write control circuit 6 configured to adjust the pulse width of the write pulse clock WPLS is used, a large circuit area is not required, thus resulting in reduction in cost of LSI.

In this embodiment, in the test mode, a logical operation in which in the work line selection period, after a potential difference is given to the pair of bit lines BL and XBL, the potential difference is reset is merely realized. Thus, there is hardly any influence of variations in resistance of an access transistor, and the technique of this embodiment is suitable for process size reduction. Furthermore, as opposed to the conventional technique, highly accurate adjustment of a write potential is not necessary. Thus, test setting is easy, and the number of test steps can be reduced.

(Second Embodiment)

Figure 3:
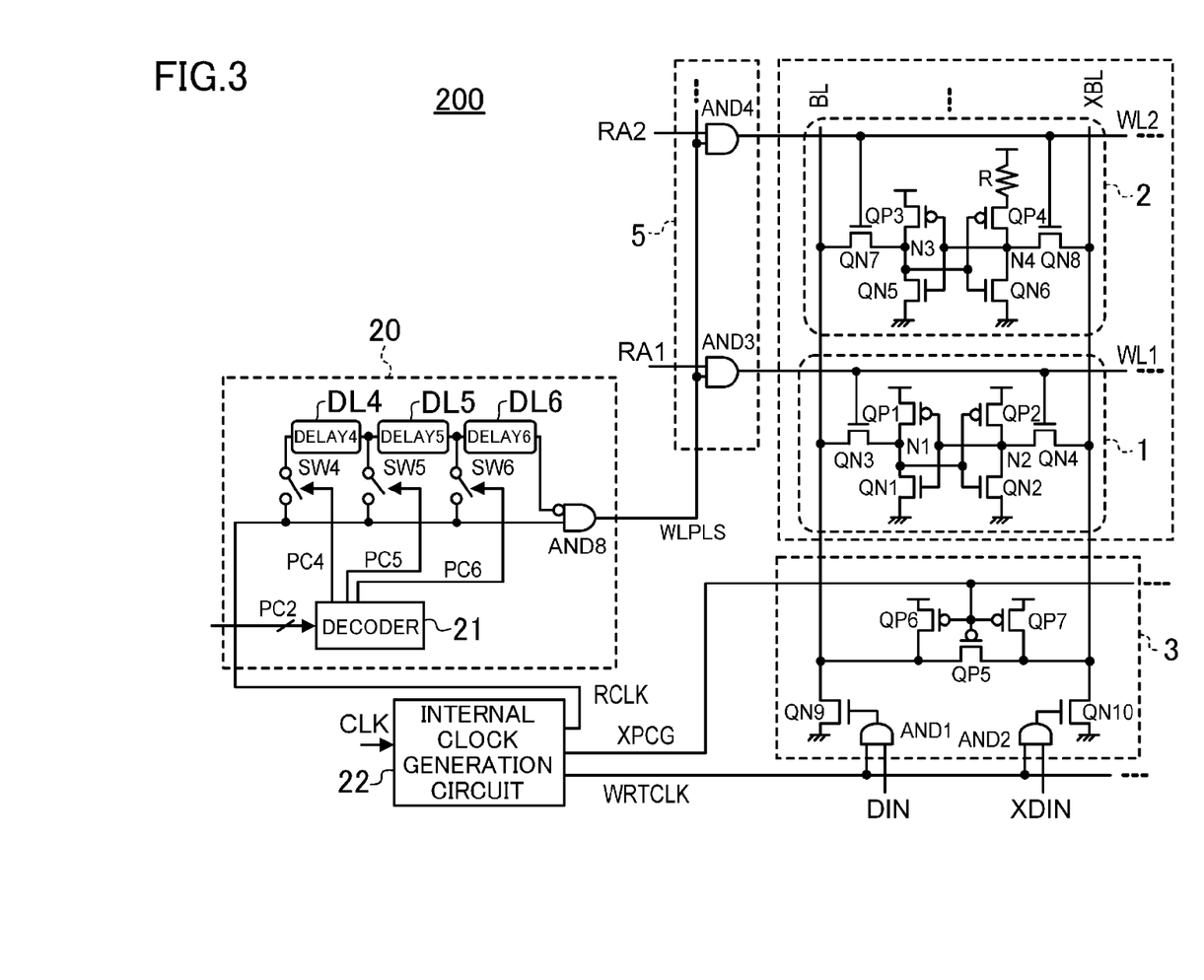
FIG. 3 is circuit diagram illustrating an example configuration of a semiconductor integrated circuit according to a second embodiment.
Figure 4A:
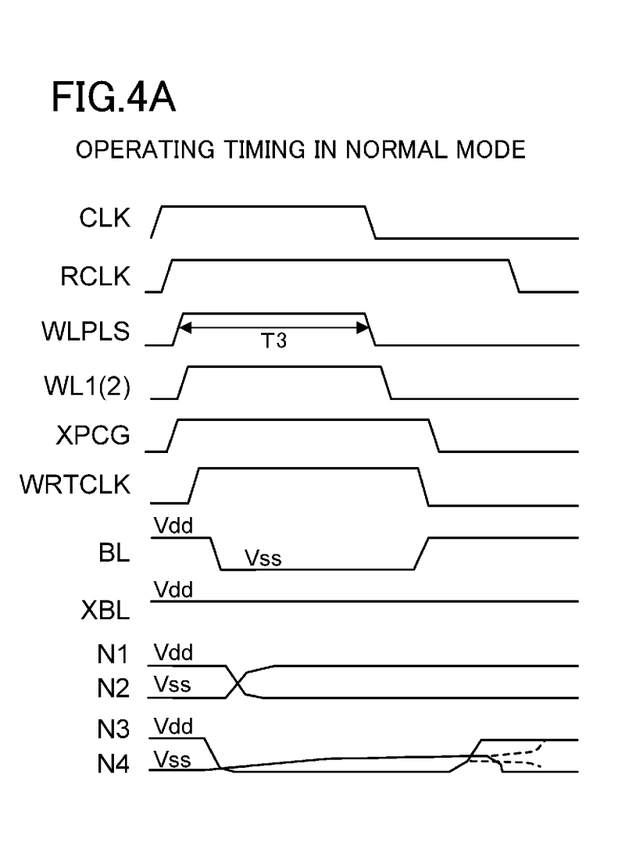
FIGS. 4A and 4B are charts showing the operation of the semiconductor integrated circuit of FIG. 3.
Figure 4B:
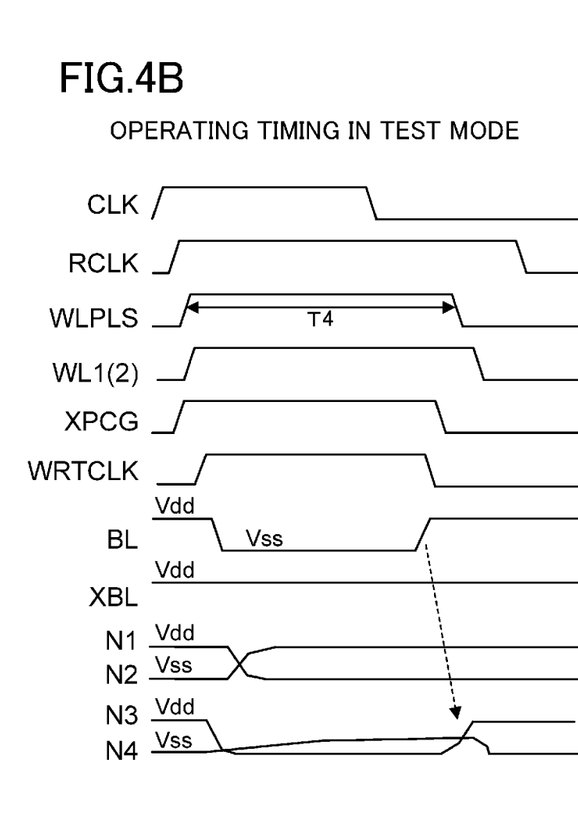

FIG. 3 is a circuit diagram illustrating an example configuration of a semiconductor integrated circuit according to a second embodiment, and FIGS. 4A and 4B are operation timing charts of the semiconductor integrated circuit of FIG. 3. In FIG. 3, each member also shown in FIG. 1 is identified by the same reference character, and the description thereof will be omitted.

Similar to the semiconductor integrated circuit 100 of FIG. 1, a semiconductor integrated circuit 200 of FIG. 3 includes bit lines BL and XBL, word lines WL1 and WL2, flip-flop memory cells 1 and 2, a write circuit 3, and a word line driver 5. The semiconductor integrated circuit 200 further includes a write control circuit 20 and an internal clock generation circuit 22.

The internal clock generation circuit 22 receives a clock signal CLK, and outputs a word line drive clock RCLK, a precharge control signal XPCG, and a write control clock WRTCLK.

The write control circuit 20 includes a decoder 21, an AND circuit AND8, and delay elements DL4-DL6 connected in series to one another. A signal line of the word line drive clock RCLK is connected to inputs of the delay elements DL4-DL6 via switches SW4-SW6, respectively. The decoder 21 generates pulse control signals PC4-PC6 in accordance with a value of a 2-bit pulse program signal PC. The switches SW4-SW6 are controlled to be on/off by the pulse control signals PC4-PC6, respectively. The AND circuit AND8 receives an inverted signal of an output of the delay element DL6, and the word line drive clock RCLK, and outputs the word line pulse clock WLPLS. The word line pulse clock WLPLS is supplied to the word line driver 5.

<Operation>

The operation of the semiconductor integrated circuit of this embodiment configured as described above will be described with reference FIGS. 4A and 4B. FIG. 4A shows a write operation during a normal mode, and FIG. 4B shows a write operation during a test mode.

—Normal Mode—

In a non-selected state before a write operation, the word lines WL1 and WL2 are at the Vss level, which is the low level. Since the precharge control signal XPCG is at the low level, the PMOS transistors QP5-QP7 become conductive, and thus, the bit lines BL and XBL are precharged to the Vdd level. The word line drive clock RCLK and the write control clock WRTCLK are at the low level.

In the write control circuit 20, the decoder 21 receives the pulse program signal PC corresponding to the normal mode, and sets a pulse control signal PC6 "selection" and other pulse control signals PC4 and PC5 "non-selection." Thus, the switch SW6 is turned in an on state, the switches SW4 and SW5 are turned in an off state, and an input of the delay element DL6 receives the word line drive clock RCLK. As a result, the word line pulse clock WLPLS to be supplied to the word line driver 5 becomes a pulse reflecting only a delay time of the delay element DL6.

When a write operation is started and the clock signal CLK rises, the internal clock generation circuit 22 causes the word line drive clock RCLK, the precharge control signal XPCG, and the write control clock WRTCLK to rise. When the word line drive clock RCLK rises, the word line pulse clock WLPLS rises accordingly. Concurrently, one of the row address signals RA1 and RA2 rises. Since the word line pulse clock WLPLS is at the high level, the level of one of the word lines WL1 and WL2 rises according to the row address signals RA1 and RA2. That is, the word line driver 5 outputs a word line selection pulse to one of the word lines WL1 and WL2 in a word line selection period. Note that a period in which the word line drive clock RCLK is at the high level is set to be sufficiently long within a range of a write cycle.

Concurrently, when the precharge control signal XPCG rises, the PMOS transistors QP5-QP7 become nonconductive, and supply of a potential to the bit lines BL and XBL is stopped.

Subsequently, the write control clock WRTCLK rises, one of the input data DIN and XDIN becomes the high level, one of outputs of the AND circuits AND1 and AND2 of the write circuit 3 becomes the high level, one of the NMOS transistors QN9 and QN10 becomes conductive, and one of the bit lines BL and XBL transitions to the Vss level. FIG. 4A shows a case where the NMOS transistor QN9 becomes conductive, the bit line BL transitions to the Vss level, and the bit line XBL stays at the Vdd level.

As shown by operating waveforms of the nodes N1-N4 of FIG. 4A, similar to the first embodiment, a write operation is correctly performed in the normal memory cell 1, and a write operation is unstable in the defective memory cell 2.

The word line pulse clock WLPLS falls after a period T3 has elapsed from a rise, and the word line WL1 or WL2 falls accordingly. Subsequently, the precharge control signal XPCG and the write control clock WRTCLK fall, and in the write circuit 3, outputs of both of the AND circuits AND1 and AND2 become the low level. Thus, discharge of the bit lines BL and XBL is stopped, and the bit lines BL and XBL are charged to the Vdd level from the PMOS transistors QP5-QP7. The word line drive clock RCLK falls, and a write operation is completed.

—Test Mode—

In the write control circuit 20, the decoder 21 receives the pulse program signal PC corresponding to the test mode, and sets a pulse control signal PC4 "selection" and other pulse control signals PC5 and PC6 "non-selection." Thus, the switch SW4 is turned in an on state, the switches SW5 and SW6 are turned in an off state, and the word line drive clock RCLK is supplied to an input of the delay element DL4. As a result, the word line pulse clock WLPLS to be supplied to the word line driver 5 becomes a long pulse reflecting the sum of respective delay times of the delay elements DL4-DL6. Other non-selected states before a write operation are the same as those in the normal mode.

When a write operation is started and the clock signal CLK rises, the internal clock generation circuit 22 causes the word line drive clock RCLK, the precharge control signal XPCG, and the write control clock WRTCLK to rise. When the word line drive clock RCLK rises, the word line pulse clock WLPLS rises accordingly. Concurrently, one of the row address signals RA1 and RA2 rises, and the level of one of the word lines WL1 and WL2 rises. Similar to the normal mode, supply of a current to the bit lines BL and XBL by the precharge control signal XPCG is stopped, and the bit line BL or XBL is discharged by the write control clock WRTCLK.

A pulse period T4 of the word line pulse clock WLPLS (a period in which the word lines WL1 and WL2 are at the high level) is a period which corresponds to the sum of delay times of the delay elements DL4-DL6 and is a longer than in the normal mode.

An operation when the normal memory cell 1 is selected by the word line WL1 is the same as that in the normal mode. That is, when the Vdd level and the Vss level are stored at the node N1 and the node N2, respectively, the levels of the nodes N1 and N2 quickly transition to the Vss level and the Vdd level, respectively.

On the other hand, when the defective memory cell 2 is selected by the word line WL2, the following operation is performed. When the Vdd level and the Vss level are stored at the node N3 and the node N4, respectively, in advance, the node N3 is discharged by the bit line BL to transition to the Vss level, and the node N4 increases from the Vss level. However, since the source of the PMOS transistor QP4 has an increased resistance and supply of a current from the PMOS transistor QP4 is not sufficient, rise of level of the node N4 becomes slow.

Subsequently, while the word line WL2 is at the high level, the write control clock WRTCLK falls, discharge of the bit line BL is stopped, and the precharge control signal XPCG falls. Thus, the bit line BL is charged by the PMOS transistors QP5-QP7, and transitions from the Vss level to the Vdd level.

As a result, since the word line WL2 is at the high level, a current is supplied to the node N3 from the bit line BL, and the node N3 transitions from the Vss level to the Vdd level. At this time, the level of the node N4 is an intermediate potential between the Vss level and the Vdd level, because of increase in level of the node N3, the node N4 cannot reach the Vdd level and returns to the Vss level, and the node N3 returns to the Vdd level. Therefore, a normal write is not performed. After the node N3 and the node N4 return to the Vdd level and the Vss level, respectively, the word line pulse clock WLPLS and the word line WL2 fall. The stored data in the defective memory cell 2 which has failed to be written is detected in a subsequent read cycle, thereby allowing identification of a defective memory cell.

As described above, in this embodiment, in the test mode, a pulse width of the word line pulse clock WLPLS is set to be longer than that in the normal mode to cause the level of the bit line BL which has been once discharged to the Vss level to rise while the word line is at the high level. That is, for the pair of bit lines BL and XBL to which a potential difference is given after a start of the word line selection period, the potential difference is reset in the word line selection period. Thus, in the defective memory cell 2, the level of the node N3 rises, and accordingly, the current capability of the NMOS transistor QN6 increases. Therefore, when supply of a current from the PMOS transistor QP4 is not sufficient, the potential of the node N4 reduces. That is, data write is blocked, and thus, a defective memory cell can be extracted by reading stored data afterward.

In this embodiment, in the test mode, a write operation is performed using the write circuit 3 as in the normal mode. Therefore, as opposed to the conventional technique, a write circuit and a bias generation circuit for the test mode do not have to be used. Also, in this embodiment, since only the simple write control circuit 20 configured to adjust the pulse width of the word line pulse clock WLPLS is used, a large circuit area is not required, thus resulting in reduction in cost of LSI.

In this embodiment, in the test mode, a logical operation in which in the work line selection period, after a potential difference is given to the pair of bit lines BL and XBL, the potential difference is reset is merely realized. Thus, there is hardly any influence of variations in resistance of an access transistor, and the technique of this embodiment is suitable for process size reduction. Furthermore, as opposed to the conventional technique, highly accurate adjustment of a write potential is not necessary. Thus, test setting is easy, and the number of test steps can be reduced.

In the above-described embodiments, the memory cells, the precharge circuit, and the write circuit have been described for only one column. However, the embodiments can be applied to a memory comprising a plurality of columns, and a write control circuit or a plurality of write control circuits may be provided for a plurality of columns.

As an example configuration of the write control circuit, the pulse generation circuit using delay elements has been described. However, as long as the pulse width is variable, any other configuration may be used for the pulse generation circuit.

Each of the write control circuit, the precharge circuit, and the word line driver may be made of any member having a similar function, and the configurations of the write control circuit, the precharge circuit, and the word line driver are not limited to the above-described embodiments.

In the present disclosure, in a semiconductor integrated circuit including flip-flop memory cells, a test function for extracting a defective memory cell can be realized with a small circuit area and less test steps, and the semiconductor integrated circuit is not affected by variations in transistor characteristic caused by reduction in size of the semiconductor integrated circuit. Therefore, the present disclosure is useful, for example, in cost reduction and increase in yield of SRAMs.

What is claimed is:
1. A semiconductor integrated circuit, comprising:
a pair of bit lines;
a plurality of word lines;
a plurality of flip-flop memory cells connected to the pair of bit lines and respectively to the word lines;
a word line driver configured to output a word line selection pulse to a word line of the plurality of word lines in a word line selection period; and
a write circuit configured to generate a first potential and a second potential to be output to the pair of bit lines respectively,
wherein a potential difference between the first potential and the second potential corresponds to input data,
in a first operation mode, the potential difference is reset during the word line selection period, and
in a second operation mode, the potential difference is reset after the word line selection period.

2. The semiconductor integrated circuit of claim 1, wherein a period in which the first and second potentials are output to the pair of bit lines is set to be shorter in the first operation mode than in the second operation mode.

3. The semiconductor integrated circuit of claim 2, further comprising:
a write control circuit configured to generate a write pulse clock to allow the first and second potentials to be output to the pair of bit lines, and output the write pulse clock to the write circuit,
wherein the write control circuit is configured so that a pulse width of the write pulse clock is variable, and the pulse width is set to be shorter in the first operation mode than in the second operation mode.

4. The semiconductor integrated circuit of claim 1, wherein the word line selection period is set to be longer in the first operation mode than in the second operation mode.

5. The semiconductor integrated circuit of claim 4, further comprising:
a write control circuit configured to generate a word line pulse clock to define the word line selection period, and output the word line pulse clock to the word line driver,
wherein the write control circuit is configured so that a pulse width of the word line pulse clock is variable, and the pulse width is set to be longer in the first operation mode than in the second operation mode.

6. The semiconductor integrated circuit of claim 1,
wherein the first operation mode is a mode in which a write operation during a test is performed, and
the second operation mode is a mode in which a write operation during a normal access is performed.

7. The semiconductor integrated circuit of claim 1, wherein when the first and second potentials are output to the pair of bit lines, one bit line of the pair of bit lines transitions from one potential to another potential, and when the potential difference is reset, the one bit line transitions from the another potential to the one potential.

8. The semiconductor integrated circuit of claim 7, wherein the one potential is higher than the another potential.

9. The semiconductor integrated circuit of claim 7, wherein the one potential is a power supply potential and the another potential is a ground potential.

* * * * *